(12) United States Patent
Li

(10) Patent No.: US 9,722,642 B2
(45) Date of Patent: Aug. 1, 2017

(54) COMPENSATION PARAMETER AND PREDISTORTION SIGNAL

(71) Applicant: TEXAS INSTRUMENTS INCORPORATED, Dallas, TX (US)

(72) Inventor: Junming Li, Beijing (CN)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 14/625,742

(22) PCT Filed: Oct. 17, 2014

(86) PCT No.: PCT/CN2014/088826
§ 371 (c)(1),
(2) Date: Feb. 19, 2015

(87) PCT Pub. No.: WO2016/058181
PCT Pub. Date: Apr. 21, 2016

(65) Prior Publication Data
US 2016/0248454 A1    Aug. 25, 2016

(51) Int. Cl.
*H04B 1/04* (2006.01)
*H03F 1/32* (2006.01)
*H03F 3/24* (2006.01)
*H04L 27/36* (2006.01)
*H03F 3/19* (2006.01)
(Continued)

(52) U.S. Cl.
CPC .......... *H04B 1/0475* (2013.01); *H03F 1/3247* (2013.01); *H03F 3/19* (2013.01); *H03F 3/21* (2013.01); *H03F 3/24* (2013.01); *H04L 27/364* (2013.01); *H04L 27/367* (2013.01); *H03F 2200/156* (2013.01); *H03F 2200/408* (2013.01); *H03F 2200/451* (2013.01); *H03F 2201/3215* (2013.01); *H04B 2001/045* (2013.01); *H04B 2001/0416* (2013.01);
(Continued)

(58) Field of Classification Search
CPC .......... H04B 1/0475; H04B 2001/0416; H04B 2001/0425; H04B 2001/045; H04L 27/367; H03F 1/3247; H03F 3/19; H03F 3/21; H03F 2200/451; H03F 2201/3215; H04W 88/08; H04W 84/042
See application file for complete search history.

(56) References Cited

U.S. PATENT DOCUMENTS 5,867,065 A * 2/1999 Leyendecker ........ H03F 1/3247
330/149
5,933,767 A   8/1999 Leizerovich et al.
(Continued)

FOREIGN PATENT DOCUMENTS

CN    1223506    7/1999
CN    1604577    4/2005

*Primary Examiner* — Freshteh N Aghdam
(74) *Attorney, Agent, or Firm* — Goutham Kondapalli; Charles A. Brill; Frank D. Cimino

(57) ABSTRACT

A controller can include a signal generator configured to provide an input signal to a modulator. The controller can be configured to generate a modulator compensation parameter in response to a modulated feedback signal corresponding to an output of the modulator. The controller can also be configured to generate a power amplifier predistortion signal in response to an amplified feedback signal corresponding to an output of a power amplifier coupled to the modulator.

21 Claims, 3 Drawing Sheets

(51) Int. Cl.
*H03F 3/21* (2006.01)
*H04W 84/04* (2009.01)
*H04W 88/08* (2009.01)

(52) U.S. Cl.
CPC ... *H04B 2001/0425* (2013.01); *H04W 84/042* (2013.01); *H04W 88/08* (2013.01)

(56) References Cited

U.S. PATENT DOCUMENTS

| | | | |
|---|---|---|---|
| 6,985,704 B2* | 1/2006 | Yang | H03F 1/3247 375/296 |
| 7,496,334 B2* | 2/2009 | Saito | H03F 1/0205 375/296 |
| 2003/0067995 A1* | 4/2003 | Matsuoka | H03C 3/406 375/296 |
| 2004/0028146 A1* | 2/2004 | Winkler | H04L 27/2626 375/260 |
| 2007/0063772 A1* | 3/2007 | Carichner | H03F 1/3241 330/149 |
| 2010/0074367 A1* | 3/2010 | Kim | H03F 1/0294 375/296 |
| 2011/0261903 A1 | 10/2011 | O'Brien et al. | |
| 2014/0133528 A1 | 5/2014 | Noest et al. | |

* cited by examiner

COMPENSATION PARAMETER AND PREDISTORTION SIGNAL

CROSS-REFERENCE TO RELATED APPLICATION

This application is a U.S. national stage entry under 35 U.S.C. 371 of International Application No. PCT/CN2014/088826 filed on Oct. 17, 2014, and entitled COMPENSATION PARAMETER AND PREDISTORTION SIGNAL. The entirety of each of the above-identified applications is incorporated by reference herein.

TECHNICAL FIELD

This disclosure relates to generating a compensation parameter and a predistortion signal.

BACKGROUND

Predistortion is a technique that can be used to improve the linearity of amplifiers. Amplifiers employed in telecommunications systems, such as radio transmitter amplifiers often need to be "linear", in that the amplifier is designed to accurately reproduce a signal present at a corresponding input. A predistortion circuit can inversely model gain and phase characteristics of the amplifier and generate a corresponding predistortion signal. When the predistortion signal is injected into the amplifier, the overall system becomes more linear and reduces the amplifier's distortion. Conceptually, the predistortion circuit introduces "inverse distortion" is introduced into the input of the amplifier, thereby cancelling some or all of the non-linearity the amplifier.

SUMMARY

This disclosure relates to generating a compensation parameter and a predistortion signal One example relates to a controller including a signal generator configured to provide an input signal to a modulator. The controller can also generate a modulator compensation parameter, in response to a modulated feedback signal corresponding to an output of the modulator. The controller can also be configured to generate a power amplifier predistortion signal in response to an amplified feedback signal corresponding to an output of a power amplifier coupled to the modulator.

Another example is related to a system including a modulator configured to generate a modulated signal in response to an input signal. The system can also include a power amplifier configured to amplify the modulated signal to provide an amplified signal. The system can further include a controller configured to separately generate a modulator compensation parameter for the modulator and a power amplifier predistortion signal for the power amplifier. The controller can also be configured to provide the input signal to the modulator. The input signal can include the modulator compensation parameter and the power amplifier predistortion signal.

Yet another example relates to a method that can include generating a modulator compensation parameter based on a modulated feedback signal characterizing an operational characteristic of a modulator. The method can also include generating a power amplifier feedback signal based on the modulated feedback signal and an amplified feedback signal from a power amplifier. The power amplifier feedback signal can characterize an operational characteristic of a power amplifier separately from characteristics a channel that provides a modulated input signal to the power amplifier. The method can further comprise generating a power amplifier predistortion signal based on the power amplifier feedback signal.

DETAILED DESCRIPTION

This disclosure relates to a system, such as a radio frequency (RF) transmitter system. The system can include a modulator configured to generate a modulated signal in response to an input signal that can be provided from a controller. The modulator can be coupled to a power amplifier configured to amplify the modulated signal to provide a corresponding amplified version of the modulated signal. The power amplifier can be coupled to an output circuit (that can include an antenna) that can be configured to propagate an RF signal into free space (e.g., wirelessly) in response to the amplified signal.

The system can also include a feedback circuit that can generate a feedback signal corresponding to either the modulated signal or the amplified signal. For instance, a switch can selectively output to the feedback circuit one of the modulated signal or amplified signal in response to a control signal from the controller. The controller can receive the feedback signal from the feedback circuit and, since the timing of the control signal is known, the controller can evaluate the modulated and amplified signals to separately generate a modulator compensation parameter for the modulator and a power amplifier predistortion signal for the power amplifier. Moreover, the controller can provide the input signal to the modulator, and the input signal can include the modulator compensation parameter and the power amplifier predistortion signal. As a result, the distortion of the modulator and distortion due to the power amplifier can be corrected separately and overall efficiency of the system can be increased. Moreover, generation of separate modulator and power amplifier predistortion signals can reduce and/or eliminate an unintended amplification of a portion of a predistortion signal.

Figure 1:
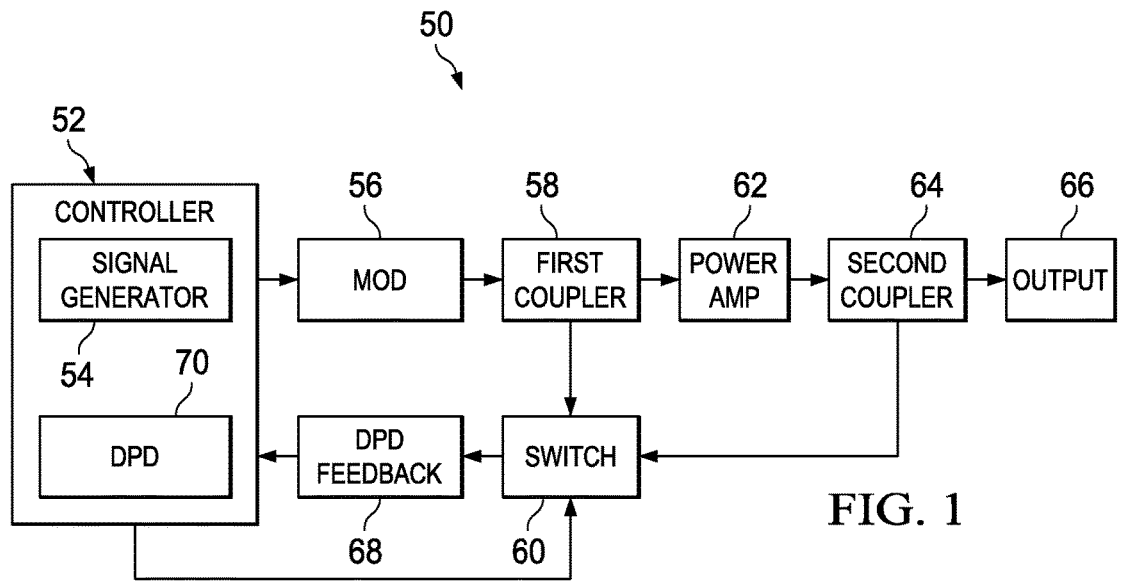
FIG. 1 illustrates an example of a system that implements a modulator compensation parameter and a power amplifier predistortion signal.

FIG. 1 illustrates an example of a system 50 that implements a modulator compensation parameter and a power amplifier predistortion signal. The system 50 can be implemented, for example, in a transmitting system, such as an RF transmitter. For instance, the system 50 can be included in a cellular network basestation, a WiFi transmitter, an RF transmitter, etc. The system 50 can include a controller 52. In some examples, the controller 52 can be implemented as a hardware device, such as an application specific integrated circuit (ASIC), a field programmable gate array (FPGA), etc. In other examples, the controller 52 can be implemented as a computing device (e.g., digital signal processor) or a microcontroller with a memory, such as volatile memory (e.g., random access memory), nonvolatile memory (e.g., a hard disk drive, a solid state drive, flash memory, etc.) or a combination thereof. In such a situation, the memory can store machine readable instructions and the controller 52 can include one or more processor cores that can access the memory and execute the machine readable instructions.

The controller 52 can include a signal generator 54 that can be configured to generate an input signal for a modulator 56 (labeled in FIG. 1 as "MOD"). The input signal can be implemented, for example as a digital signal. The modulator 56 can include a quadrature amplitude modulation (QAM) modulator, an amplitude modulation (AM) modulator, a frequency modulation (FM) modulator, etc. Additionally, in some examples, the modulator 56 can include signal conditioning components and/or other circuitry of a transmission channel apart from a power amplifier 57. The modulator 56 can include circuitry of a transmit channel apart from the power amplifier 57. For example, the modulator 56 can include circuitry, such as a digital to analog converter (DAC) that is configured to convert the digital signal into a corresponding analog signal and encode the corresponding analog signal onto a carrier signal to form a modulated signal.

The modulator 56 can provide the modulated signal to a first coupler 58. The first coupler 58 can be implemented, for example, as a power coupler (e.g., a directional coupler), configured such that a relatively small portion (e.g., about 5% or less) of the modulated signal is diverted to a switch 60, and the remaining portion (e.g., about 95% or more) of the modulated signal is provided to the power amplifier 57 (labeled in FIG. 1 as "POWER AMP"). The power amplifier 57 can be implemented as a nonlinear power amplifier, such as a Class A-D amplifier. The power amplifier 57 can amplify the modulated signal to generate an amplified signal.

The amplified signal can be provided to a second coupler 64. The second coupler 64 can be configured in a manner similar to the first coupler 58. In this manner, the second coupler 64 can divert a relatively small portion (e.g., about 5% or less) of the amplified signal to the switch 60 and the remaining portion (e.g., about 95% or more) of the amplified signal to an output circuit 66. The output circuit 66 can include, for example, an antenna that propagates an RF signal into free space based on the amplified signal.

The switch 60 can be implemented, for example, as a single pole double throw (SPDT) switch or the like that can be configured to provide a feedback signal to a digital pre-distortion (DPD) feedback circuit 68. The DPD feedback circuit 68 can be coupled to the controller 52. The switch 60 can select between outputting the diverted portion of the modulated signal as the feedback signal and outputting the diverted portion of the amplified signal as the feedback signal. The selection can be controlled, for example, by a control signal provided from the controller 52. The DPD feedback circuit 68 can be configured to condition the feedback signal and convert the conditioned feedback signal from an analog signal into a digital feedback signal and provide the digital feedback signal to the controller 52. In this manner, the digital feedback signal can correspond to either the modulated signal or the amplified signal over a time period set according to the control signal. The digital feedback signal corresponding to the modulated feedback signal can be referred to as a digital modulated feedback signal and the digital feedback signal corresponding to the amplified signal can be referred to as a digital amplified feedback signal.

The controller 52 can include a DPD component 70 that can be configured to cause the controller 52 to provide a control signal to the switch 60 that causes the switch 60 to provide the portion of the modulated signal as the feedback signal, such that the digital modulated feedback signal can be received at the controller 52. The DPD component 70 can store the digital modulated feedback signal and the DPD component 70 can analyze the digital modulated feedback signal to model operational characteristics, such as gain and phase characteristics of the modulator 56. Additionally, the DPD component 70 can be configured to generate a modulator compensation parameter that can compensate for imbalances in the modulator 56. For example, if the modulator 56 includes a QAM modulator, the modulator compensation parameter can be implemented as a quadrature modulator correction signal that change a phase and/or a gain of a signal injected into the QAM modulator (e.g., the input signal) to compensate for I and Q ("I/Q") imbalances that are present in the QAM modulator.

Moreover, the DPD component 70 can be configured to cause the controller 52 to send a control signal to the switch 60 that causes the switch 60 to provide the portion of the amplified signal as the feedback signal such that the digital amplified feedback signal can be received at the controller 52. The DPD component 70 can access the stored digital modulated feedback signal and subtract the digital modulated feedback signal from the digital amplified feedback signal to form a power amplifier digital feedback signal.

The DPD component 70 can analyze the power amplifier digital feedback signal to model operational characteristics such as the gain and/or phase characteristic of the power amplifier 57. The DPD component 70 can generate a power amplifier predistortion signal that inversely models the operational characteristics (e.g., the gain and phase characteristics) of the distortion caused by the power amplifier 57.

The DPD component 70 can provide the modulator compensation parameter and the power amplifier predistortion signal to the signal generator 54 of the controller 52. In response, the signal generator 54 can employ the modulator parameter to change an operational characteristic, such as a gain and/or phase characteristic of the input signal as well as adding the power amplifier predistortion signal to the input signal. The modulator compensation parameter can compensate for imbalances (e.g., I/O imbalances) induced by the modulator 56 and other circuitry of the transmit channel apart from the power amplifier 57. Moreover, the modulator 56 can be configured such that the effects of the change to the operational characteristic (e.g., the gain and/or phase) of the input signal based on the modulator compensation parameter is substantially canceled from the input signal during generation of the modulated signal. Additionally, inclusion of the power amplifier predistortion signal in the input signal can reduce nonlinearity effects induced by the power amplifier 57. In such a situation, the power amplifier 57 can be configured such that the power amplifier predistortion signal is substantially canceled from the modulated signal during generation of the amplified signal.

By employing this system 50, the RF signal propagated by the output circuit 66 can represent a substantially linearly amplified analog version of the input signal provided by the signal generator 54. Since the effects of the change to the operational characteristic of the input signal based on the modulator compensation parameter can be substantially canceled by the modulator 56 prior the power amplifier 57 receiving the modulated signal, the power amplifier 57 can avoid an unwanted amplification of distorted signals. Moreover, by generating the modulator compensation parameter and the power amplifier predistortion signals separately, the generated modulator compensation parameter and the power amplifier predistortion signal can more accurately reflect the separate operational characteristics of the modulator 56 and the power amplifier 57.

Figure 2:
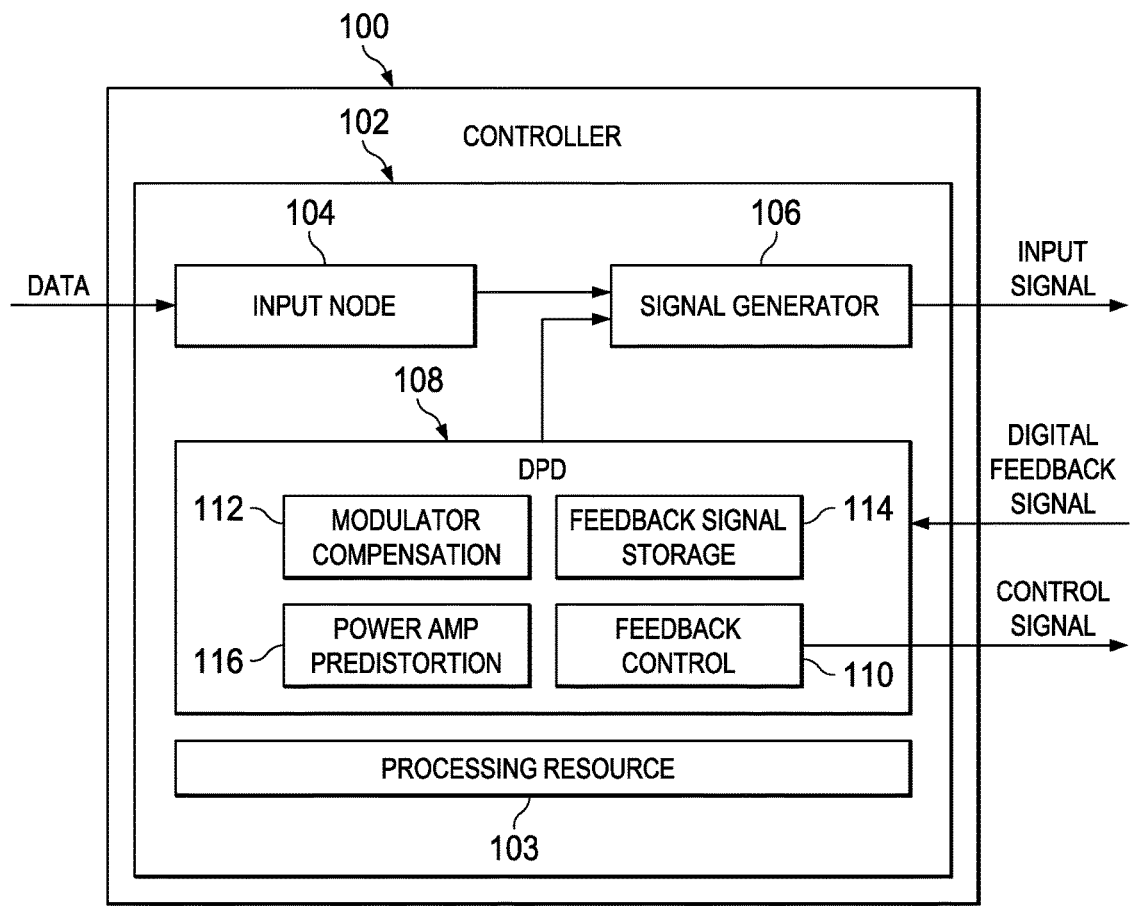
FIG. 2 illustrates an example of a controller that generates a modulator compensation parameter and a power amplifier predistortion signal.

FIG. 2 illustrates an example of a controller 100, such as the controller 52 of FIG. 1 that can be employed in a transmission system. The controller 100 can include a memory 102 that can store machine readable instructions. The memory 102 can be implemented as volatile or non-volatile memory. The controller 100 can also include a processing resource 103 that can access the memory 102 and execute the machine readable instructions. The processing resource 103 can include one or more processor cores. In some examples, the controller 100 can be implemented as a microcontroller. In other examples, the controller 100 can be implemented as an integrated circuit (IC) chip, such as an FPGA and/or an ASIC.

The memory 102 can include an input node 104 that can receive data (labeled in FIG. 2 as "DATA") that can characterize a signal to be transmitted. In some examples, the input node 104 can include a buffer. The data can be provided, for example, from data storage (e.g., memory). Additionally or alternatively, the data can be provided from a network node, such a router. In either situation, the data can be provided to a signal generator 106. The signal generator 106 can generate an input signal (labeled in FIG. 2 as "INPUT SIGNAL") that corresponds to the data. The input signal can be provided to a modulator (e.g., the modulator 56 of FIG. 1). As explained with respect to FIG. 1, the modulator can cooperate with a power amplifier and an output circuit to propagate an RF signal into free space.

The controller 100 can also include a DPD component 108 that can be configured to receive a digital feedback signal (labeled in FIG. 2 as "DIGITAL FEEDBACK SIGNAL") from a DPD feedback circuit (e.g., the DPD feedback circuit 68 of FIG. 1). The DPD component 108 can include a feedback control 110 that can output a control signal to a switch (e.g., the switch 60 of FIG. 1) that is coupled to the DPD feedback circuit.

The feedback control 110 of the DPD component 108 can be configured to send the control signal to cause the switch to provide a modulated feedback signal to the DPD such that a digital modulated feedback signal can be provided from the DPD feedback circuit as the digital feedback signal. The DPD component 108 can also include a modulator compensation component 112 that can analyze the digital modulated feedback signal to determine operational characteristics of the modulator, such as a gain and a phase characteristic of the modulator. The modulator predistortion component 112 can store the digital modulated feedback signal in a feedback signal storage 114 (e.g., a storage medium). Additionally, the modulator compensation component 112 can determine the distortion and/or I/Q imbalance of the modulator and transmit channel, more generally, and generate a compensation parameter for the modulator based on the determined operational characteristics of the modulator, which can be referred to as a modulator compensation parameter. The modulator compensation parameter can be generated so as to compensate for imbalances (e.g., I-Q imbalances) induced by the modulator or other components in the transmit channel apart from the power amplifier. For instance, if the modulator includes a QAM modulator, the imbalances could be spurious imbalances, such as local oscillator ("LO") leakage. Additionally or alternatively, the imbalances of the modulator can include I/Q imbalances of the modulator, such as I/Q amplitude imbalances, I/Q phase imbalances, and/or I/Q direct current ("DC") offset. In some examples, the modulator compensation component 112 can employ a Quadrature Modulator Correct ("QMC") process (or other process) to generate the modulator compensation parameter. The modulator compensation parameter can be employed adjust an operational characteristic the input signal (e.g., a gain and/or phase) to compensate for imbalances induced the modulator and thereby improve the linear operation of the modulator. Stated differently, the modulator compensation parameter can be employed to change/adjust operational characteristics (e.g., a gain and/or a phase) of a signal input into the modulator (e.g., the input signal) to compensate for an imbalance (e.g., an I/Q imbalance) of the modulator. Moreover, the effects of the change to the operational characteristic (e.g., the gain and/or phase) of a signal that traverses the modulator (such as the input signal) based on the compensation parameter can be canceled from the signal.

The feedback control 110 can be configured to receive an indication that the modulator compensation parameter has been generated. In response to the indication, the feedback control 110 can employ the control signal to cause the switch to provide an amplified feedback signal to the DPD feedback circuit such that a digital amplified feedback signal can be provided to the DPD component 108 from the DPD feedback circuit as the digital feedback signal. The DPD component 108 can include a power amplifier predistortion component 116 that can be configured to receive the digital amplified feedback signal. Moreover, the power amplifier predistortion component 116 can access the feedback signal storage 114 to retrieve the digital modulated feedback signal. The power amplifier predistortion component 116 can be configured to subtract the digital modulated feedback signal from the digital amplified feedback signal to form a power amplifier digital feedback signal.

The power amplifier predistortion component 116 can be configured to analyze the power amplifier digital feedback signal to determine operational characteristics of a power amplifier (e.g., the power amplifier 57 of FIG. 1). Moreover, the power amplifier predistortion component 116 can be configured to determine signal distortion due to the power amplifier and generate a predistortion signal for the power amplifier, which can be referred to as a power amplifier predistortion signal. The power amplifier predistortion signal can be based on the determined operational characteristics (e.g., an inverse of the determined operational characteristics) of the power amplifier and/or the determined signal distortion induced by the power amplifier. The power amplifier predistortion signal can be generated so as to reduce and/or eliminate inherent nonlinearities induced by the power amplifier. The power amplifier predistortion signal can be injected into the input signal to cancel distortion in the power amplifier and thereby improve the linear operation of the power amplifier. Stated differently, the nonlinear effects of the power amplifier can substantially cancel the power amplifier predistortion signal embedded in a signal (such as the modulated signal) that traverses the power amplifier. The power amplifier predistortion component 116 can be configured to provide an indication to the feedback control 110 that the power amplifier predistortion signal has been generated.

In response to receiving both of the indications that the modulator compensation parameter and the power amplifier predistortion signal have been generated, the feedback control 110 can cause the DPD component 108 to forward both the modulator compensation parameter and the power amplifier predistortion signal to the signal generator 106. The signal generator 106 can be configured to adjust an operational characteristic (e.g., a gain and/or a phase) of the input signal based on the modulator compensation parameter. Additionally, the signal generator 106 can be configured to add the power amplifier predistortion signal with the input signal.

Generating the modulator compensation parameter and the power amplifier predistortion signal separately can substantially avoid an undesirable amplification of a portion of a (single) predistortion signal. That is, adjusting an operational characteristic (e.g., a gain and/or a phase) of the input signal based on the modulator compensation parameter and injection of the power amplifier predistortion signal reduces channel distortion such that the channel distortion is not amplified by the power amplifier to adversely affect the calculation of the modulator compensation parameter or the amplifier predistortion signal. Moreover, generating the modulator compensation parameter and the power amplifier predistortion signal separately can ensure that each and the modulator compensation parameter and the power amplifier predistortion signal accurately reflects the I/Q imbalances of the modulator and the nonlinearities of the power amplifier as compared to the generation of a predistortion signal based on a single feedback signal.

Figure 3:
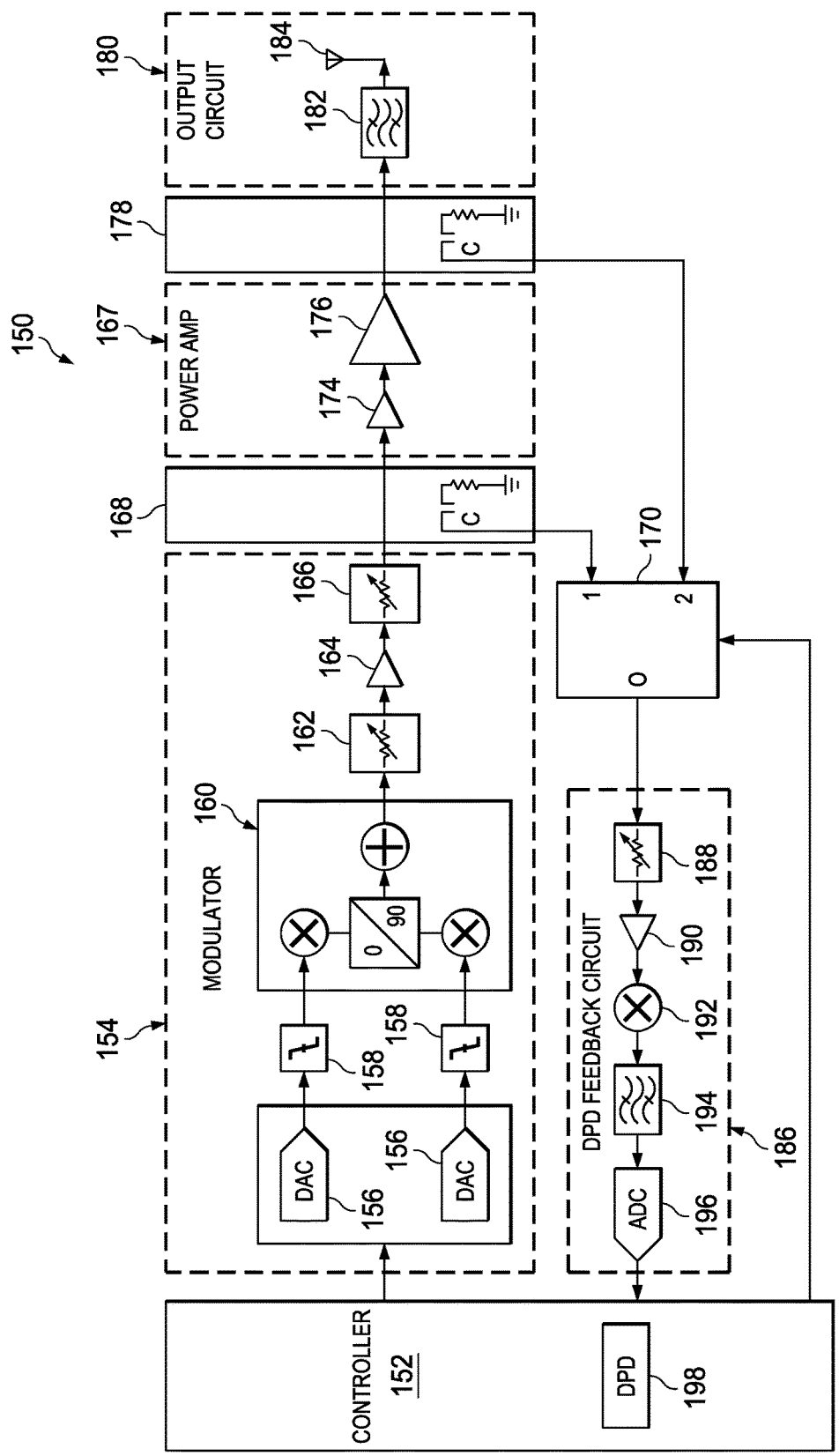
FIG. 3 illustrates an example of a transmitter system that implements a modulator compensation parameter and a power amplifier predistortion signal.

FIG. 3 illustrates an example of a transmitter system 150 that implements a modulator compensation parameter and a power amplifier predistortion signal. The transmitter system 150 could be employed, for example, to implement the system 50 of FIG. 1. The transmitter system 150 can include a controller 152, such as the controller 52 illustrated in FIG. 1 and/or the controller 100 illustrated in FIG. 2. The transmitter system 150 could be employed for example in an RF transmitter system, such as a cellular network, a WiFi network, etc.

The controller 152 can be configured to provide an input signal to a modulator 154. The input signal can be, for example, a digital signal. The modulator 154 can be implemented, for example, as a QAM transmitter channel. In such a situation, the input signal can be split into two signals and converted by corresponding digital to analog converters (DACs) 156 of the modulator 154 into two analog signals. The two analog signals can be provided to corresponding low pass filters 158 that can filter noise, such as quantization noise to form two filtered signals. The two filtered signals can be passed to a QAM modulator 160. The QAM modulator 160 can be configured to encode the two filtered signals onto two carrier signals, wherein each of the two carrier signals are separated by a phase shift of 90 degrees to form two encoded signals. The QAM modulator 160 can also combine the encoded signals to form a modulated signal. The modulated signal can be received by an impedance matcher 162 of the transmitter. Moreover, the modulated signal can be input into a buffer 164 (or preamplifier) of the modulator 154 and provided through another impedance matcher 166 of the modulator 154. As explained herein, the modulator can include circuitry of a transmitter channel apart from a power amplifier 167. Components of the modulator 154, such as the QAM modulator 160 can induce spurious caused by I/Q imbalances, such as LO leakage. Additionally or alternatively, I/Q imbalances of the components of the modulator 154 can cause mirror products, such as including but are not limited to I/Q amplitude imbalance, I/Q phase imbalance and/or I/Q DC offset.

The modulated signal output by the modulator 154 can be provided to a power coupler, which can be implemented, for example, as a directional coupler 168. In such a situation, a coupled port (labeled in FIG. 2 as "C") of the directional coupler 168 can provided to a given input port (labeled in FIG. 3 as "1") of a switch 170, and a through port of the directional coupler 168 can be provided to the power amplifier 167. Moreover, an isolated port of the directional coupler 168 can be coupled to an electrically neutral node (e.g., ground). The directional coupler 168 can be configured such that a relatively small portion (e.g., about 5% or less) of the modulated signal is diverted to the switch 170 in response to the switch being activated. The remaining portion of the modulated signal can be provided to the power amplifier 167.

The power amplifier 167 can include, for example, a buffer 174 (e.g., a preamplifier) and an amplifier 176 coupled in series. The power amplifier 167 can amplify the modulated signal by a predetermined amount based on a gain of the power amplifier 167 to form an amplified signal. The amplified signal can be provided to an input port of another power coupler (e.g., another directional coupler 178). In the example illustrated, a through port of the other directional coupler 178 can be coupled to an output circuit 180. Moreover, a coupled port (labeled in FIG. 3 as "C") of the other directional coupler 178 can be coupled to another input port (labeled in FIG. 3 as "2") of the switch 170 and an isolated port of the directional coupler can be coupled to the electrically neutral node. The other directional coupler 178 can be configured such that a relatively small portion (e.g., about 5% or less) of the amplified signal is diverted to the other input port of the switch 170 in response to the switch being activated and the remaining portion of the amplified signal is provided to the output circuit 180.

The output circuit 180 can include, for example a bandpass filter 182 and an antenna 184 coupled in series. The output circuit 180 can be configured such that the amplified signal is filtered by the bandpass filter 182 and propagated into free space by the antenna 184.

As one example, the switch 170 can be configured as a single pole, double throw (SPDT) switch, or the like that can be configured to select between outputting the diverted portion of the modulated signal and the diverted portion of the amplified signal to a DPD feedback circuit 186 as a feedback signal. The DPD feedback circuit 186 can include an impedance matcher 188, and a buffer 190 (or preamplifier) coupled in series that receives the feedback signal. The output of the buffer 190 can be provided to a mixer 192 of the DPD feedback circuit 186 that can remove a carrier signal or carrier signals (added by the QAM modulator 190) from the feedback signal. The output of the mixer 192 can be provided to a bandpass filter 194 of the DPD feedback circuit 186 that can filter the feedback signal. The output of the bandpass filter 194 can be provided to an analog to digital converter (ADC) 196 of the DPD feedback circuit 186 that can convert the feedback signal into a digital feedback signal. The digital feedback signal can be provided to the controller 152.

The controller 152 can control the switch 170 via a control signal. As explained with respect to FIGS. 1 and 2, the controller 152 can include a DPD component 198 that can be configured to control the switch 170 and generate a modulator compensation parameter that can be employed to change an operational characteristic (e.g., a gain and/or a phase) of the input signal and to generate a power amplifier predistortion signal that can be added to the input signal.

The modulator compensation parameter can be set such that upon the input signal passing through the modulator 154 and providing the modulated signal, the effect of the change to the operational characteristic (e.g., the gain and/or phase) of the input signal based on the modulator compensation parameter is substantially canceled out by imbalances (e.g., LO leakage, I/Q amplitude imbalance, I/Q phase imbalance and/or I/Q DC offset) in the modulator 154. Moreover, the power amplifier predistortion signal can be configured such that upon the modulated signal passing through the power amplifier 167, the power amplifier predistortion signal is substantially canceled out by the nonlinearities of the power amplifier 167. In this manner, both the modulator compensation parameter and the power amplifier predistortion signal can be substantially canceled by nonlinearities and imbalances induced by components in the transmitter system 150, thereby increasing the effective linearity of the transmitter system 150.

Moreover, since, as explained with respect to FIGS. 1 and 2, the modulator compensation parameter and the power amplifier predistortion signal are generated separately, the effect of the change to the operational characteristic (e.g., the gain and/or phase) of the input signal based on the modulator compensation parameter is substantially removed (e.g., canceled) from the input signal prior to the modulated signal (that corresponds to the input signal) being amplified by the power amplifier 167. In this manner, an undesirable amplification of the modulator compensation parameter can be avoided. Furthermore, by generating the modulator compensation parameter and the power amplifier predistortion signal separately, each of the modulator compensation parameter and the power amplifier predistortion signal more accurately reflects the operational characteristics of the modulator and the power amplifier 167 compared to situations where only one predistortion signal is employed.

Figure 4:
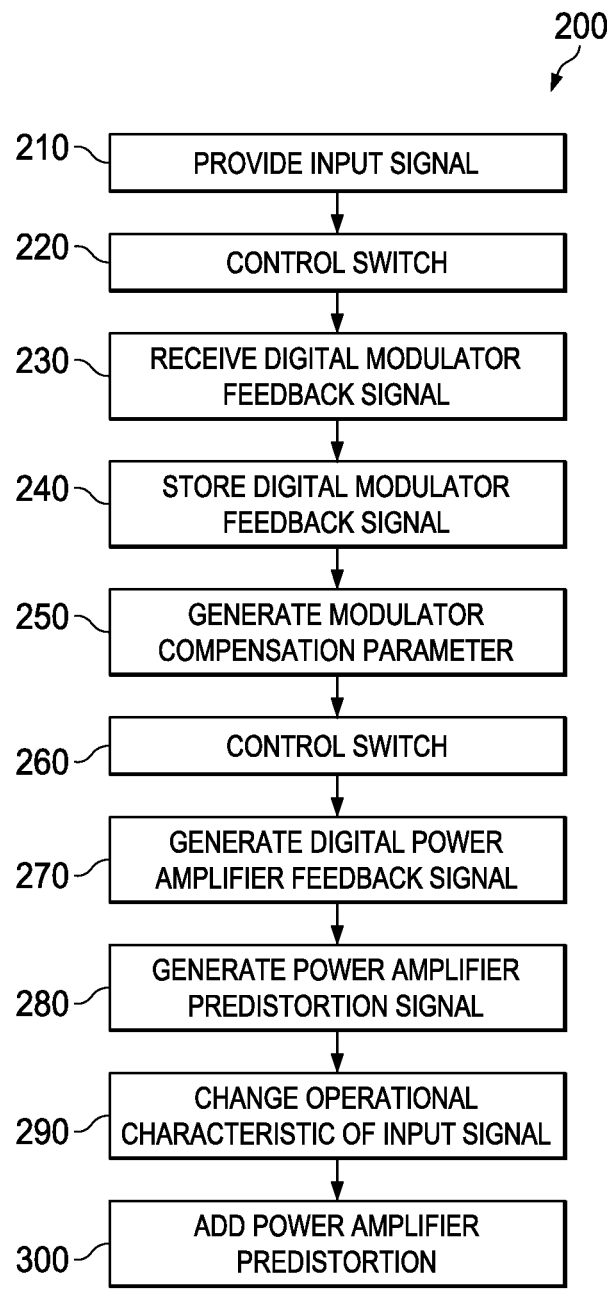
FIG. 4 illustrates an example flowchart of a method for generating a modulator compensation parameter and a power amplifier predistortion signal.

In view of the foregoing structural and functional features described above, example methods will be better appreciated with reference to FIG. 4. While, for purposes of simplicity of explanation, the example method of FIG. 4 is shown and described as executing serially, it is to be understood and appreciated that the presence examples are not limited by the illustrated order, as some actions could in other examples occur in different orders, multiple times and/or concurrently from that shown and described herein. Moreover, it is not necessary that all described actions be performed to implement a method. The example method of FIG. 4 can be implemented in a production test environment as machine executable instructions. The instructions can be accessed by a processing resource (e.g., one or more processor cores) and executed to perform the methods disclosed herein.

FIG. 4 illustrates an example of a method for generating a modulator compensation parameter and a power amplifier predistortion signal. The method 200 can be implemented, for example, by a controller (e.g., the controller 50 illustrated in FIG. 1 and/or the controller 100 illustrated in FIG. 2). In the method 200, the controller can be implemented in a system, such as the system 50 illustrated in FIG. 1 and/or the transmitter system 150 illustrated in FIG. 3.

At 210, an input signal can be provided (e.g., by the controller) to a modulator (e.g., the modulator 56 of FIG. 1). The input signal can be a digital signal with data to be transmitted over a wireless connection. At 220, a control signal can be provided to a switch (e.g., the switch 60 of FIG. 1) by the controller that controls the switch to output a feedback signal corresponding to a modulated feedback signal. At 230, a digital modulated feedback signal corresponding to the modulated feedback signal can be received by the controller from a DPD feedback circuit (e.g., the DPD feedback circuit 68 illustrated in FIG. 1 and/or the DPD feedback circuit 186 illustrated in FIG. 3). At 240, the digital modulated feedback signal can be stored in a memory (e.g., the feedback signal storage 114 illustrated in FIG. 2). At 250, the controller can generate a modulator compensation parameter based on operational characteristics (e.g., a gain and a phase characteristic) of the modulator. In particular, the modulator predistortion signal can be configured to change the gain and/or phase characteristic a complex signal to reduce imbalances (e.g., I/Q imbalances) induced by the modulator. The modulator compensation parameter can be generated, for example, based on an analysis of the digital modulator feedback signal.

At 260, the switch can be controlled by the controller to cause the switch to output the feedback signal corresponding to an amplified feedback signal, such that a digital amplified signal can be received by the controller from the DPD feedback circuit. At 270, digital a power amplifier feedback signal based on the digital amplified feedback signal and the digital modulated feedback signal can be generated by the controller. The digital power amplifier feedback signal can characterize operational characteristics of a power amplifier separately from characteristics of a channel (that can include the modulator) that provides a modulated signal to the power amplifier. As one example, to generate the digital power amplifier feedback signal, the digital modulated feedback signal can be subtracted by the controller from the digital amplified feedback signal. At 280, a power amplifier predistortion signal can be generated by the controller. The power amplifier predistortion signal can be based, for example, the digital power amplifier feedback signal that can characterize operational characteristics (e.g., a gain and a phase characteristic) of the power amplifier. In particular, the power amplifier predistortion signal can be based on an inverse of the operational characteristics of the power amplifier.

At 290, the modulator compensation parameter can be employed by the controller to adjust an operational characteristic (e.g., a gain and/or a phase) of the input signal. At 300, the amplifier predistortion signal can be added to the input signal by the controller. As explained herein, the modulator compensation parameter can be configured such that the effect on the input signal caused by the change to the operational characteristic (e.g., the gain and/or phase) of the input signal based on the modulator compensation parameter is substantially canceled from the input signal during traversal through the modulator during generation of a modulated signal. Additionally, the power amplifier predistortion signal can be configured such that the power amplifier predistortion signal is substantially canceled from the modulated signal during traversal through the power amplifier during generation of an amplified signal.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A controller comprising:
   a signal generator configured to provide an input signal to a modulator;

wherein the controller is configured to:
generate a modulator compensation parameter in response to a modulated feedback signal corresponding to an output signal of the modulator, the modulated feedback signal being a portion of the output signal of the modulator and being coupled to the controller; and
generate a power amplifier predistortion signal in response to an amplified feedback signal corresponding to an output signal of a power amplifier, the power amplifier coupled to the modulator and configured to receive the output signal of the modulator, the amplified feedback signal being a portion of the output signal of the power amplifier and being coupled to the controller, wherein the modulated feedback signal is different from the amplified feedback signal.

2. The controller of claim 1, wherein the controller is further configured to subtract the modulated feedback signal from the amplified feedback signal to form a power amplifier feedback signal.

3. The controller of claim 2, wherein the controller is further configured to store the modulated feedback signal in a memory.

4. The controller of claim 1, wherein the controller is further configured to analyze the modulated feedback signal to determine an operational characteristic of the modulator.

5. The controller of claim 4, wherein the operational characteristic of the modulator characterizes an imbalance induced by the modulator.

6. The controller of claim 1, wherein the controller is further configured to analyze the amplified feedback signal to determine an operational characteristic of the power amplifier.

7. The controller of claim 6, wherein the operational characteristic of the power amplifier comprises at least one of a gain and a phase characteristic of the power amplifier.

8. The controller of claim 1, wherein the controller is further configured to control a switch that selects between the modulated feedback signal and the amplified feedback signal for coupling to the controller.

9. The controller of claim 1, wherein an operational characteristic of the input signal is changed based on at least one of: the modulator compensation parameter and the power amplifier predistortion signal.

10. A system comprising:
a modulator comprising an input and an output, the modulator configured to generate a modulated signal at its output in response to an input signal at its input, the input signal provided by a controller;
a power amplifier comprising an input and an output, the power amplifier configured to amplify the modulated signal at its input to provide an amplified signal at its output; and
a switch comprising:
a first input port coupled to the output of the modulator,
a second input port coupled to the output of the power amplifier, and
an output port coupled to the controller for providing a feedback signal corresponding to at least one of: the output of the modulator and the output of the power amplifier.

11. The system of claim 10, further comprising:
a digital predistortion (DPD) feedback circuit configured to receive the feedback signal from the switch, the DPD feedback circuit being configured to provide a DPD output feedback signal to the controller.

12. The system of claim 11, wherein the DPD feedback circuit comprises:
a mixer configured to generate a mixer output signal, the mixer output signal being generated by substantially removing a carrier signal from the feedback signal; and
an analog to digital converter (ADC) configured to generate the DPD output feedback signal by converting the mixer output signal into a digital feedback signal, wherein the digital feedback signal is provided to the controller.

13. The system of claim 10, further comprising:
the controller configured to:
generate a modulator compensation parameter for the modulator and a power amplifier predistortion signal for the power amplifier; and
provide the input signal to the modulator, wherein an operational characteristic of the input signal is changed based on at least one of: the modulator compensation parameter and the power amplifier predistortion signal.

14. The system of claim 13, wherein the modulator comprises a quadrature amplitude modulation (QAM) channel, and the modulator compensation parameter is employed to change an operational characteristic of the input signal to compensate for an I/Q imbalance induced by the QAM channel.

15. The system of claim 14, further comprising an output circuit configured to propagate a radio frequency (RF) signal in response to the amplified signal.

16. A cellular network basestation comprising the system of claim 15, wherein the cellular network basestation is configured to provide data to the controller, wherein the input signal is based on the data.

17. The system of claim 13, wherein the modulator compensation parameter is configured to change at least one of a phase and gain characteristic of the input signal to compensate for an imbalance induced by the modulator.

18. A method comprising:
generating, by a controller, a modulator compensation parameter based on a modulated feedback signal corresponding to an output signal of a modulator, the modulated feedback signal being a portion of the output signal of the modulator and being coupled to the controller; and
generating a power amplifier predistortion signal based on an amplified feedback signal corresponding to an output signal of a power amplifier, the power amplifier coupled to the modulator and configured to receive the output signal of the modulator, the amplified feedback signal being a portion of the output signal of the power amplifier and being coupled to the controller, wherein the modulated feedback signal is different from the amplified feedback signal.

19. The method of claim 18, further comprising:
generating an input signal for the modulator, wherein an operational characteristic of the input signal is changed based on at least one of: the modulator compensation parameter and the power amplifier predistortion signal.

20. The method of claim 19, wherein an effect of a change to the operational characteristic of the input signal based on the modulator compensation parameter is substantially cancelled by the modulator while the modulator is modulating the input signal.

21. The method of claim 19, wherein an effect of the power amplifier predistortion signal on the amplified signal is substantially cancelled by the power amplifier while the power amplifier is amplifying the output signal of the modulator.

* * * * *